(12) United States Patent
Hoppe et al.

(10) Patent No.: US 8,986,821 B2
(45) Date of Patent: Mar. 24, 2015

(54) GLIDING ELEMENT

(75) Inventors: Steffen Hoppe, Overath (DE); Manfred Fischer, Leichlingen (DE); Marcus Kennedy, Dusseldorf (DE)

(73) Assignee: Federal-Mogul Burscheid GmbH, Burscheid (DE)

( * ) Notice: Subject to any disclaimer, the term of this patent is extended or adjusted under 35 U.S.C. 154(b) by 600 days.

(21) Appl. No.: 13/321,689

(22) PCT Filed: May 19, 2010

(86) PCT No.: PCT/EP2010/056885
§ 371 (c)(1),
(2), (4) Date: Mar. 6, 2012

(87) PCT Pub. No.: WO2010/133633
PCT Pub. Date: Nov. 25, 2010

(65) Prior Publication Data
US 2012/0161401 A1    Jun. 28, 2012

(30) Foreign Application Priority Data
May 19, 2009 (DE) .......................... 10 2009 003 232

(51) Int. Cl.
*F16J 9/26* (2006.01)
*C23C 14/06* (2006.01)

(52) U.S. Cl.
CPC .............. *C23C 14/0605* (2013.01); *F16J 9/26* (2013.01)
USPC ............ 428/217; 277/442; 428/336; 428/408

(58) Field of Classification Search
CPC ..................... B23B 2215/247; B23B 2226/31; B23B 2307/536; F16J 9/26
USPC .......................... 277/442; 428/217, 336, 408
See application file for complete search history.

(56) References Cited

U.S. PATENT DOCUMENTS

| | | | |
|---|---|---|---|
| 6,110,329 A * | 8/2000 | Holleck et al. | 204/192.15 |
| 6,528,115 B1 | 3/2003 | Hirano et al. | |
| 7,406,940 B2 * | 8/2008 | Nishimura et al. | 123/193.6 |
| 7,771,798 B1 | 8/2010 | Grosse et al. | |
| 7,955,691 B2 * | 6/2011 | Moronuki et al. | 428/217 |

(Continued)

FOREIGN PATENT DOCUMENTS

| | | |
|---|---|---|
| DE | 29605666 U1 | 5/1996 |
| DE | 19625329 A1 | 1/1998 |

(Continued)

OTHER PUBLICATIONS

Han et al "Stress, mechanical and adhesion properties of multilayer tetrahedral amorphous carbon films" Apllied Surface Science 255 (2008) p. 607-609.*

(Continued)

*Primary Examiner* — Archene Turner
(74) *Attorney, Agent, or Firm* — Robert L. Stearns; Dickinson Wright, PLLC

(57) ABSTRACT

The invention relates to a sliding element for an internal combustion engine, especially a piston ring having a DLC coating of ta-C, which has at least one residual stress gradient, a negative residual stress gradient being present in the center region of the coating, when seen from the outside to the inside, said gradient being preferably smaller that the inner region, and the inner region having smaller thickness that the center region.

9 Claims, 1 Drawing Sheet

(56) References Cited

U.S. PATENT DOCUMENTS

Figure 1:
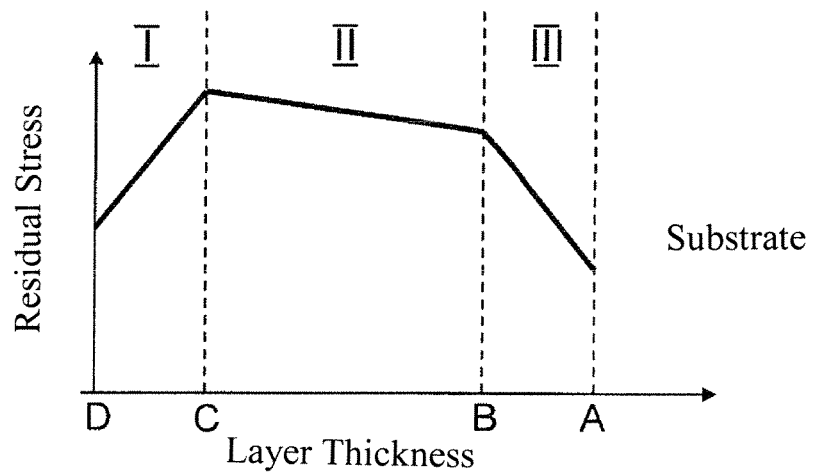

| | | | |
|---|---|---|---|
| 8,201,831 B2* | 6/2012 | Hoppe et al. | 277/440 |
| 2005/0005892 A1 | 1/2005 | Nishimura et al. | |
| 2007/0224349 A1* | 9/2007 | Hosenfeldt et al. | 428/688 |
| 2008/0292812 A1 | 11/2008 | Ramm et al. | |
| 2009/0001669 A1 | 1/2009 | Hoppe et al. | |
| 2009/0011225 A1 | 1/2009 | Moronuki et al. | |
| 2013/0140776 A1* | 6/2013 | Kennedy | 277/442 |

FOREIGN PATENT DOCUMENTS

| | | | |
|---|---|---|---|
| DE | 102005063123 B3 | | 5/2007 |
| EP | 1992715 A1 | | 11/2008 |
| WO | 9749840 A1 | | 12/1997 |
| WO | 2007020139 A1 | | 2/2007 |
| WO | WO2007079834 A1 | | 7/2007 |

OTHER PUBLICATIONS

Logothetidis et al "A new process for the development of hard and stable sputtered amorphous films", Vacuum 53 (1999) p. 61-65.*

Teo E H T et al. "Mechanical Properties of gradient pulse biased amorphous carbon film," Thin Solid Films, Elsevier-Sequoia S.A. Lausanne, Bd. 516, Nr. 16, Jun. 30, 2008, pp. 5364-5367.

Sheeja D et al: "Structural and tribological characterization of multilayer Ta—C films prepared by filtered cathodic vacuum arc with substrate pulse biasing," Surface and Coatings Technology Elsevier Switzerland, vol. 132, Nr. 2-3, Oct. 23, 2000, pp. 228-232.

Spaeth C et al: "Mechanical properties of carbon nitride thin films prepared by ion beam assisted filtered cathodic vacuum arc deposition," Surface and Coatings Technology Elsevier Switzerland, vol. 112, Nr. 1-3, Feb. 1999, pp. 140-145.

Robertson J: "Diamond-like amorphous carbon," Materials Science and Engineering R: Reports, Elsevier Sequoia S.A., Lausanne, vol. 37, Nr. 4-6, May 24, 2002, pp. 129-281.

Siegal M P et al: "Bonding topologies in diamondlike amorphous-carbon films," Applied Physics Letters, AIP, American Institute of Physics, Melville, NY, US vol. 76, Nr.15, Apr. 10, 2000, pp. 2047-2049. See p. 2047, right column, line 6-p. 2048, right column, line 23.

International Search Report—PCT/EP2010/056885 mailed on Aug. 13, 2010.

* cited by examiner

GLIDING ELEMENT

BACKGROUND OF THE INVENTION

1. Technical Field

The invention relates to a sliding element in an internal combustion engine, in particular a piston ring.

2. Related Art

Fuel consumption plays a significant role in the reduction of carbon dioxide emissions from internal combustion engines. It is greatly affected by the frictional losses in the engine, especially in the area of the pistons, such as at the piston rings. There is consequently a demand for sliding elements in internal combustion engines, in particular piston rings, that exhibit as favourable as possible a frictional performance throughout their service life. With regard to the overall service life, it is necessary to specifically consider the running-in performance, a possible lack of lubrication, and potential scorching, all of which result in altered tribological characteristics.

In the above-mentioned field, PVD coatings of hard materials are known which have a good wear resistance, but which could be improved with regard to their coefficients of friction.

DE 10 2005 063 123 B3 discloses a layer structure comprising, from the outside inwards, a running-in layer, an adhesive layer, and a wear-protection layer. However, it has become apparent that further improvements can be made to the performance of the friction characteristics over its service life.

U.S. Pat. No. 6,528,115 relates to a sliding element with a carbon coating having a varying $sp^2/sp^3$ ratio, particularly one which may decrease outwardly from the substrate, and then increase again to the outside of the coating.

SUMMARY OF THE INVENTION

An object of the invention is to provide a sliding element for an internal combustion engine, in particular a piston ring, which has a coating that reliably possesses favourable frictional characteristics over as long a time period as possible.

Accordingly, the sliding element comprises a ta-C type DLC coating which has residual stresses that vary over its thickness. In other words, at least one residual stress gradient is formed across the thickness of the coating. "DLC" refers to diamond-like carbon. The ta-C type is characterised by a tetrahedral structure, is hydrogen-free, and is defined, for example, in the German VDI guideline 2840. A layer of this type provides good frictional performance, as well as a particularly long service life for the reasons set out below.

Firstly, varying the residual stresses over the thickness of the layer allows the creation of large layer thicknesses, for example greater than 10 μm, without introducing problems regarding the adherence or brittleness of the layer. The reason for this is that it was found, for example, that zones of low residual stress in the layer provide local relaxation or stress-relief to the entire layer composite, i.e. to the multilayer coating. Thus, the yield point of the DLC coating is not exceeded when subjected to high shear stresses, such as occur when used in an internal combustion engine. Hence, this is an effective way of limiting wear of the coating.

For a center region of the coating that is neither fully outside nor fully inside, a negative residual stress gradient has proved effective, preferably one that is less than the negative residual stress gradient at the inside, i.e. in the area where the coating meets the base material. This means that the highest level of residual stress lies comparatively far towards the outside of the coating, which implies a favourable performance. In this context, the center region has a larger layer thickness than the inner region, preferably significantly larger, at around three times the thickness.

For the junction between the coating and the base material of the sliding element, a negative residual stress gradient in this, i.e. an inner, region of the coating of the sliding element, as viewed from the outside inwards, has proved to be advantageous. In other words, the residual stresses decrease to a low value towards the base material, thereby achieving a favourable stress transistion to the base material and good adhesion of the layer.

For an outer region, a positive residual stress gradient, as viewed from the outside inwards, has proved to be advantageous. In other words, the residual stress at the outer surface of the coating is at a comparatively low level, which has proved to be advantageous for favourable running-in performance. From here, there is preferably a sharp increase in residual stresses towards the inside, so that the aforementioned effects can be achieved.

Especially in the case of sliding elements for which extremely high surface pressures are anticipated, it is favourable to have a constant, low-level residual stress distribution at the innermost region i.e. directly adjoining the base material.

Furthermore, the running-in performance can be further improved by a likewise constant and a comparatively low-level residual stress distribution at the outside of the coating, but it is preferably at a higher level than the level in the innermost region.

In an alternative embodiment also described herein, a centre region with extensively alternating residual stresses has proved to be advantageous for the avoidance of crack propagation in the coating. Here, the dimensions of the zones of low residual stress may be shorter, equal to, or longer than the dimensions of the zones of high residual stress.

Possible values for the periodicity, i.e. the thickness from the start of a region of low residual stress, through a region of high residual stress, up to the start of the next region of low residual stress, are 0.01 to 1 μm.

The measures described allow the creation of coatings having thicknesses of 10 μm or greater, giving a favourable running-in performance, but also having sufficient layer thickness to ensure that the coating has a long service life with favourable friction characteristics after being subjected to inevitable wear.

In order to create the different residual stresses, it is advantageous, for example, to alter the ratio between sp2- and sp3-hybridised carbon atoms. In particular, compressive residual stresses can be increased by increasing the sp3 content, thereby enabling the formation of a residual stress gradient.

The same applies if the density increases, and hence by changing the density of the layer across its thickness, it is envisaged that the residual stresses across the layer thickness can be altered in an advantageous manner.

Finally, consideration has been given to altering the hardness of the layer across its thickness, since a greater hardness results in greater compressive residual stresses, and hence this also enables the desired residual stress gradients to be set.

Detailed Description

Exemplary embodiments of the invention are described in detail below, with reference to the drawings.

Figure 2:
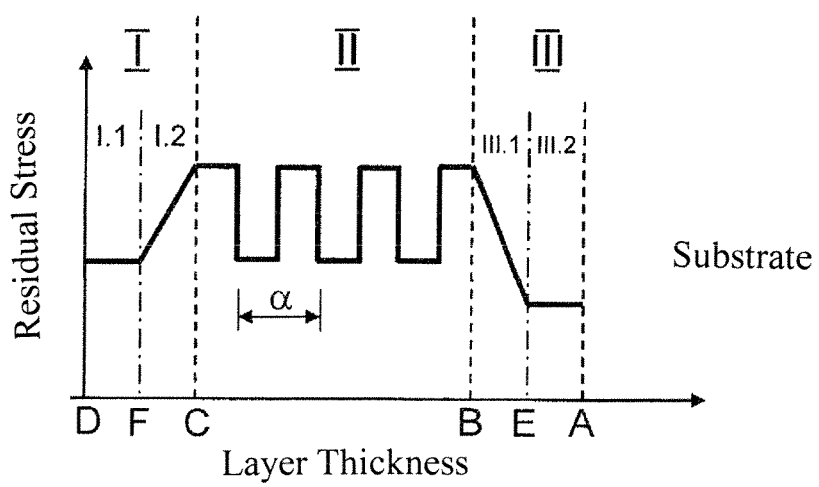

FIG. 1 is a diagram of the residual stress distribution across the thickness of a DLC coating in accordance with a first embodiment; and FIG. 2 is a diagram of the residual stress distribution across the thickness of a DLC coating in accordance with a second, non-inventive embodiment.

DETAILED DESCRIPTION OF DRAWINGS

The figures show the residual stresses across the thickness of the respective DLC coatings, an outermost region of the coating being shown on the left of the figures, while an innermost region of the coating is shown on the right. In other words, the base material, such as steel or cast iron, lies on the right, adjoining the coating with the depicted residual stresses.

The embodiment of FIG. 1 comprises a negative residual stress gradient (from the outside to the inside), starting at an inner region, or the "base" of the coating (Zone III). In other words, the residual stresses at the junction between the coating and the base material are at a particularly low level, so as to achieve a good stress transition and good adhesion of the coating. In a centre region (Zone II) the residual stress continues increasing, but at a lower gradient, up to its highest level. At the outside (Zone I), the residual stresses reduce sharply, thus forming a large positive residual stress gradient from the outside inwards, which results in a favourable running-in performance. The centre region II is significantly larger than the inner region III and/or the outer region I. Preferably, the centre region II is larger than both of the other regions I and III. These two regions I and III may have approximately the same thickness. The thickness of the centre region II is preferably significantly larger than that of the two other regions, in particular around three times the thickness of each of the other regions I and III.

In the embodiment of FIG. 2, the residual stresses in an outermost zone I are initially at a constant low level, and then rise sharply (Zone I.2). This provides an appropriate transition between Zone I, and a Zone II where the residual stresses extensively alternate. It has been shown that a state of constant, high-level residual stress is prone to cracking, especially when under shear stress loads. The alternating residual stresses in Zone II inhibit the propagation of cracks. By way of example, the periodicity in this region may be in the range 0.1 to 1 μm. In a similar manner to the embodiment of FIG. 1, there is an adjoining zone III.1 of highly negative residual stress gradient facing the base material (to the right of the figure), and a zone III.2 of constant, low-level residual stress directly adjacent to the base material, to provide a good stress transition to the base material, and achieve good adhesion. Specifically, the residual stress level in Zone III.2 may be lower than that in the outermost zone I.1, and the residual stresses in Zone II may vary between absolute maxima and a level slightly above that of Zone I.

It should be added that the regions I extending from point D to point C in both figures roughly correspond to each other. The same applies to the centre region II, i.e. between points C and B, and the respective regions III, i.e. between points B and A. In particular, the above-mentioned thickness ratios also apply to FIG. 2. Finally, it should be noted that features of each of the above-described embodiments may be combined with each other, where they are not contradictory.

The invention claimed is:

1. A sliding element for an internal combustion engine, comprising a ta-C DLC coating applied to a base material of the sliding element which has residual stresses that vary over its thickness to define at least one residual stress gradient, wherein a negative residual stress gradient, as viewed from outside the sliding element inwards, is formed in a center region (II) of the coating that is less than a residual stress gradient of an inner region (III) of the coating, and that the inner region (III) of the coating has a smaller layer thickness than that of the center region (II) and wherein the coating is at least 10 μm thick.

2. The sliding element according to claim 1, wherein another negative residual stress gradient, as viewed from the outside inwards, is provided in an inner region (III) of the coating facing the base material.

3. The sliding element according to claim 1 including a positive residual stress gradient, as viewed from the outside inwards, is provided in an outer region (I) of the coating.

4. The sliding element according to claim 3, wherein the residual stresses in an innermost (III.2) and/or outermost region (I.1) of the coating are substantially constant.

5. The sliding element according to claim 4, wherein the residual stresses in the innermost region of the coating are lower than in the outermost region thereof.

6. The sliding element according to claim 1, wherein at least one region having a residual stress gradient comprises a varying ratio between sp2- and sp3-hybridised carbon atoms.

7. The sliding element according to claim 1, wherein at least one region having a residual stress gradient comprises a varying layer density.

8. The sliding element according to claim 1, wherein at least one region having a residual stress gradient comprises a varying layer hardness.

9. The sliding element according to claim 1, wherein the sliding element comprises a piston ring.

\* \* \* \* \*